United States Patent [19]

Blumenthal et al.

[11] Patent Number: 5,100,501
[45] Date of Patent: Mar. 31, 1992

[54] PROCESS FOR SELECTIVELY DEPOSITING A METAL IN VIAS AND CONTACTS BY USING A SACRIFICIAL LAYER

[75] Inventors: Roc Blumenthal, Dallas; Rebecca J. Gale, Richardson, both of Tex.

[73] Assignee: Texas Instruments Incorporated, Dallas, Tex.

[21] Appl. No.: 375,092

[22] Filed: Jun. 30, 1989

[51] Int. Cl.$^5$ .................................... H01L 21/00
[52] U.S. Cl. .................... 156/643; 156/646; 156/657; 156/662; 427/99; 427/123; 437/203; 437/238; 437/241; 437/245
[58] Field of Search ........... 156/643, 646, 664, 659.1, 156/655, 657, 662; 427/96, 97, 99, 123, 124; 437/228, 235, 238, 203, 241, 245

[56] References Cited

U.S. PATENT DOCUMENTS

| | | | |
|---|---|---|---|
| 4,528,211 | 7/1985 | Bragat | 156/664 |
| 4,606,788 | 8/1986 | Moran | 156/664 |
| 4,617,087 | 10/1986 | Iyer et al. | 456/345 X |
| 4,640,739 | 2/1987 | Modic et al. | 156/659.1 |
| 4,702,792 | 10/1987 | Chow et al. | 156/664 |
| 4,707,394 | 11/1987 | Chant | 156/668 |
| 4,732,658 | 3/1988 | Lee | 156/659.1 |
| 4,774,164 | 9/1988 | Peavey et al. | 156/659.1 |
| 4,824,522 | 4/1989 | Baker et al. | 156/646 |
| 4,853,277 | 8/1989 | Chant | 156/668 |
| 4,857,140 | 8/1989 | Loewenstein | 156/659.1 |
| 4,902,533 | 2/1990 | White et al. | 427/99 |

Primary Examiner—David A. Simmons
Assistant Examiner—Thi Dang
Attorney, Agent, or Firm—Stanton C. Braden; Richard L. Donaldson; William E. Hiller

[57] ABSTRACT

A process for selectively depositing a contacting material (20) in trenches (18) for a via or contact which selectively eliminates potential metal contaminants (22) by removing a sacrificial layer (16) after the material (20) is selectively deposited. Initially, the trenches (18) are formed by selectively exposing the substrate (10) to an etchant (19). After metal material (20) is deposited into the formed trenches (18), a chemical etchant (24) is used to remove the sacrificial layer (16) and any formed contaminants (22).

14 Claims, 1 Drawing Sheet

PROCESS FOR SELECTIVELY DEPOSITING A METAL IN VIAS AND CONTACTS BY USING A SACRIFICIAL LAYER

TECHNICAL FIELD OF THE INVENTION

The present invention relates in general to a process for filling vias and contacts for integrated circuits, and in particular to a process for selectively depositing a contacting metal in trenches of a contact or a via by using a sacrificial layer.

BACKGROUND OF THE INVENTION

A demand exists for an integrated circuit that can achieve submicron resolution with sufficient line width control on a substrate. The surfaces of these integrated circuits must be patterned with extreme accuracy at submicron levels. Unfortunately, problems of surface contamination have occurred using prior methods of filling submicron trenches of vias and contacts in integrated circuits.

To meet this problem, several techniques have been developed which concentrate on the selective deposition of metal, such as tungsten, within the trenches of the vias and contact. Unfortunately, the selective deposition processes of tungsten and other contacting metals have resulted in contamination of the insulator surfaces of the integrated circuit workpiece. When depositing contacting metals selectively in trenches of vias and contacts, metal particulates have a tendency to deposit on other areas of the integrated circuit workpiece which result in electrical shorting of the circuitry. Consequently, when reducing the size of the vias and contacts in order to accommodate decreasing design rules to increase the speed of the integrated circuit, there is an offset disadvantage of an increase in sensitivity to metal contaminants which tend to cause damage and eventually short circuit the integrated circuit.

Therefore, a need has arisen for a simple method of filling trenches of vias and contacts in integrated circuits with a metal which will eliminate problems of contamination on the integrated circuit workpiece which can cause short circuiting of the entire integrated circuit.

SUMMARY OF THE INVENTION

One aspect of the present invention comprises a process for depositing a contacting metal in trenches of contacts and vias of a integrated circuit workpiece. Initially, a silicon oxide is deposited on the layer to be contacted. Subsequently, a sacrificial layer is deposited onto the silicon oxide layer of the integrated circuit workpiece. In its preferred embodiment, the sacrificial layer is a silicon nitride which is deposited at a thickness between approximately 1000 and 1500 angstroms. After the sacrificial layer has been deposited, the trenches of the vias or the contacts are formed by etching through the sacrificial layer and the silicon oxide layer to expose the surface of the contacting layer. One of the desireable etching processes is a fluorine based-plasma etching technique capable of cutting through the sacrificial layer and silicon oxide layer.

Once the desired configuration of the trenches of the vias and the contacts has been formed, a contacting metal, such as tungsten, is deposited selectively within the trenches of the vias and the contacts to a level approximately even with the interface between the sacrificial layer and the silicon oxide layer. When the tungsten is deposited within the trenches, several tungsten contaminant particles may be deposited onto the exposed surface of the sacrificial layer. In accordance with the present invention, these contaminants are removed by subsequent removal of the sacrificial layer. The sacrificial layer is chemically etched from the silicon oxide layer by using a hot phosphoric acid having a concentration of approximately 83.5 percent and a temperature of approximately 160° centigrade. When removing the sacrificial layer, it is preferable to have an etching solution which selectively etches the sacrificial layer at a faster rate than the silicon oxide layer. Once the sacrificial layer has been removed from the silicon oxide layer, the integrated circuit workpiece is ready for further fabrication.

The present invention presents technical advantages over conventional methods of depositing selective tungsten within trenches of vias and contacts for integrated circuits because of the ability to have process quality control relating to the location of the deposited material. The present invention also has the technical advantage of increased cleanliness, and the elimination of the metal contaminants on the surface of the integrated circuit which can cause eventual short circuiting of the entire integrated circuit.

BRIEF DESCRIPTION OF THE DRAWINGS

Other aspects of the invention and their advantages will be discerned after studying the Detailed Description in conjunction with the drawings in which.

DETAILED DESCRIPTION OF THE INVENTION

Figure 1:
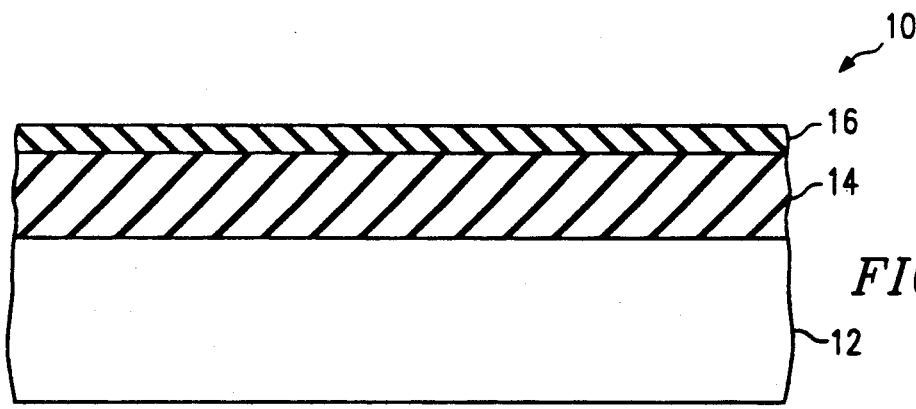
FIG. 1 is an enlarged cross-sectional view of an integrated circuit workpiece illustrating silicon oxide formed onto a contacting layer and a sacrificial layer deposited onto the oxide layer in accordance with the present invention.

Referring to FIG. 1, an integrated circuit workpiece is shown in an enlarged schematic cross-sectional view and is generally designated 10. Workpiece 10 comprises a layer 12 having an oxide layer 14 formed thereon. Additionally, a sacrificial layer 16 is uniformly deposited onto the exposed surface of layer 14.

In accordance with the present invention, layer 12 may be used for a plurality of different devices. For example, layer 12 may comprise a microprocessor. In the present invention, layer 12 may be selected from the group comprised of tungsten, aluminum, copper, nickel, molybdenium, tantalum, tantalum silicide, titanium, titanium silicide, silicon, polysilicon and combination thereof.

Oxide layer 14 may be an Interlevel Oxide (ILO) or a Multilayer Oxide (MLO). Oxide layer 14 is deposited onto layer 12 by methods well known in the art. For example, the deposition of oxide layer 14 may be deposited by Low Pressure Chemical Vapor Deposition (LPCVD). In its preferred embodiment, oxide layer 14 is a silicon oxide deposited by LPCVD using tetraethylorthosilicate (TEOS) as the primary source of the silicon and oxygen. Oxide layer 14 will normally have a thickness between approximately 6000 angstroms and 10,000 angstroms.

Referring still to FIG. 1, sacrificial layer 16 is preferably formed of silicon nitride ($Si_2N_3$) Alternatively, sacrificial layer 16 may be selected from highly doped silicon oxide, Atmospheric Pressure Chemical Vapor Deposition (APCVD) oxide, or undensified spin on glass. In accordance with the present invention, layer 16 may comprise silicon nitride deposited onto the oxide layer 14 at a thickness between approximately 1000 angstroms to 1500 angstroms.

Figure 2:
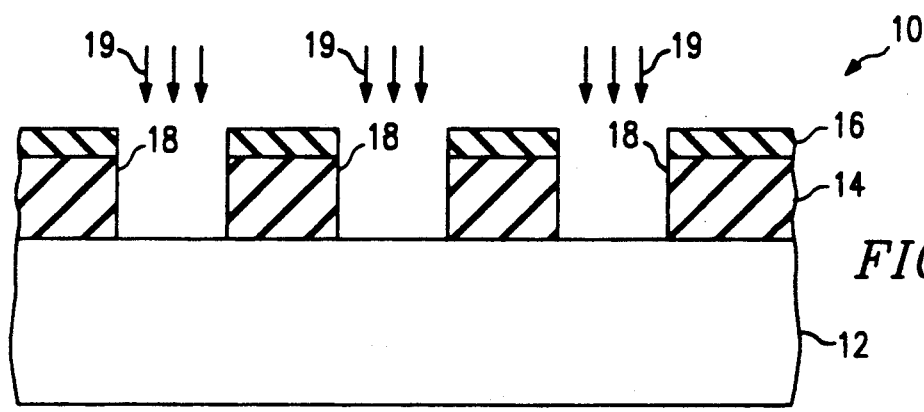
FIG. 2 is a cross-sectional view of the workpiece shown in FIG. 1, illustrating a subsequent selective exposure of an etchant which forms trenches of the vias or contacts.

Referring now to FIG. 2, subsequent process steps can be seen. The workpiece 10 is masked and exposed to an etchant 19 which is used to selectively remove sacrificial layer 16 and oxide layer 14. When exposed to etchant 19, sacrificial layers 16 and oxide layer 14 are removed to form trenches 18 for creating vias or contacts. Trenches 18 can be formed by other selective etching methods well known in the art. Etchant 19 is preferably a fluorine-based plasma etchant used to remove sacrificial layer 16 and oxide layer 14. Etchant 19 may comprise a plasma formed from a combination of helium. $CHF_3$ and $C_2F_6$. In its preferred embodiment, etchant 19 does not remove a significant portion of layer 12.

As integrated circuits become more complicated, there is a need for submicron sized trenches 18 for vias and contacts in order to increase the device speed and circuit packing density by reducing the design rules including the width of trenches 18 in workpiece 10. In accordance with the present invention, metal deposition can be accomplished in trenches 18 having a width between approximately 6000 angstroms and 10,000 angstroms.

When designing integrated circuits, much attention is given to the Aspect Ratio which is defined as the height divided by the width of trench 18. According to prior experiences with the Aspect Ratio, the selective deposition of a contacting metal becomes increasingly more difficult to maintain when dealing with high Aspect Ratios. In accordance with the present invention, the Aspect Ratio may be as high as 1.6. Prior to the present invention, selective filling of contacts or vias with Aspect Ratios of 1.25 were difficult to accomplish.

Figure 3:
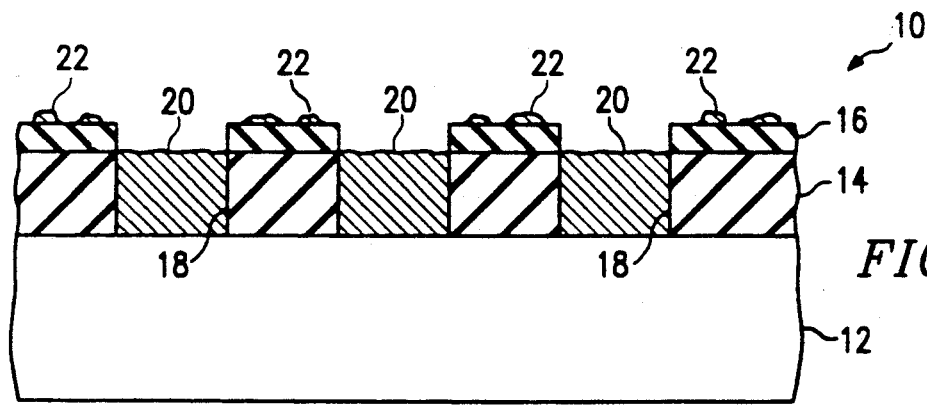
FIG. 3 is a cross-sectional view of the workpiece shown in FIG. 2, illustrating subsequent filling of the trenches of the vias or contacts with a contacting metal according to the present invention.

Referring to the subsequent processing steps, FIG. 3 shows the selective deposition of a metal material 20 in trenches 18. In its preferred embodiment, metal 20 is tungsten. In alternative embodiments, metal material 20 is selected from the group of copper, nickel, molybdenium, tantalum, tantalum silicide, titanium, titanium silicide, titanium nitride, aluminum, and a combination thereof. As is well recognized in the art, when selectively depositing tungsten 20 there is a tendency for particulates to be deposited within areas not designated. For example, contaminants 22 may be deposited onto sacrificial layer 16, which creates many problems. For example, electrical shorts can result from having tungsten contaminants 22 on surfaces of the integrated circuit workpiece.

When depositing metal layer 20, it is desirable to fill trenches 18 to a level approximately even with the interface between sacrificial layer 16 and oxide layer 14. Once the trenches 18 have been filled with metal contacting layer, the subsequent and final processing step can be conducted.

Figure 4:
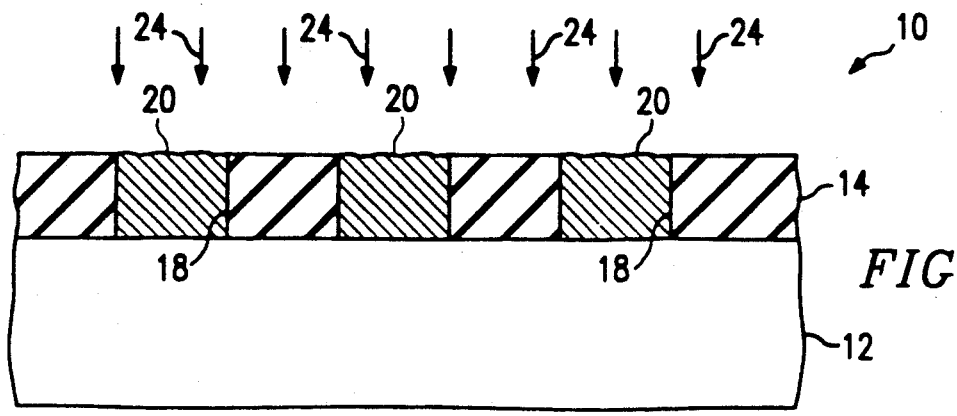
FIG. 4 is a cross-sectional view of the workpiece shown in FIG. 3, illustrating a subsequent etching step for removing the sacrificial layer and the contacting metal contaminants from the integrated circuit workpiece in accordance with the present invention.

Referring now to FIG. 4, it can be seen that device 10 is exposed to an etchant 24. Etchant 24 is preferably a hot phosphoric acid having a temperature between approximately 150 degrees and 170 degrees centigrade. In alternative embodiments, etchant 24 may be hydrogen fluoride diluted to approximately 1% buffered solution, depending on the sacrificial layer used.

In accordance with the present invention, etchant 24 removes the sacrificial layer 16 from the oxide layer 14. Additionally, when removing sacrificial layer 16, etchant 24 removes the metal contaminants 22 from the workpiece 10. By removing contaminants 22 from workpiece 10, potential electrical shorting of the integrated circuit can be avoided. Once etchant 24 has removed the sacrificial layer 16 from oxide layer 14, the surface of the integrated circuit is essentially contaminant-free. In accordance with the present invention, sacrificial layer 16 is stripped off at faster rate than oxide layer 14. Additionally, to adequately remove sacrificial layer 16, the exposure time to the etchant 24 is increased and decreased proportional to the thickness of sacrificial layer 16. In the lab, a decreased defect density has been seen. The defect density is the extent, or number, of contaminants 22 per square centimeter.

As can be seen in FIG. 4, sacrificial layer 16 has been removed to provide a plurality of tungsten contacts 20 which electrically connect to layer 12.

In summary, the present invention avoids problems with electrical shorts developed from the breakdown of deposition of metal during selective tungsten filling of trenches of contacts or vias. In accordance with the present invention, a sacrificial layer is removed after the contacting metal has been deposited in the trenches. This removal of the sacrificial layer results in the elimination of metal contaminants developed during the metal deposition process. The benefits of the present invention are a simplified process that avoids potential electrical shorting of the manufactured integrated circuit.

While the preferred embodiment of the present invention and their advantages have been disclosed in the above-detailed description, the invention is not limited thereto but only by the spirit and scope of the appended claims.

What is claimed is:

1. A process for selectively depositing a contacting metal in trenches of a substrate, comprising the steps of:
   placing an oxide layer on the substrate;
   placing, on the oxide layer, a sacrificial layer selected from the group consisting of silicon nitride, silicon oxide, atmospheric pressure chemical vapor deposition oxide, undensified spin on glass or a combination thereof, an oxide layer/sacrificial layer interface being formed there between;
   etching trenches in the substrate to a desired configuration;
   placing the contacting metal in the trenches to a level substantially even with the oxide layer/sacrificial layer interface; and
   chemically removing the sacrificial layer with an acidic etchant.

2. The process of claim 1, wherein the contacting metal comprises tungsten, copper, nickel, molybdenium, tantalum, or titanium.

3. The process of claim 1, wherein said stop of etching trenches is conducted by exposing the substrate to a fluorine based-plasma etchant.

4. The process of claim 2, wherein said removing step is conducted such that the sacrificial layer is stripped off at a faster rate than the substrate.

5. The process of claim 1, wherein said step of depositing the sacrificial layer creates a layer having a thickness between approximately 1000 to 1500 angstroms.

6. The process of claim 1, wherein said trench is formed with a width between approximately 6000 angstroms to approximately 10,000 angstroms.

7. The process of claim 1, wherein said contacting metal is selected form the group consisting of copper, nickel, molybdenum, tantalum, tantalum silicide, titanium, titanium silicide, titanium nitride, aluminum, a combination thereof and tungsten.

8. A process for depositing a contacting metal in trenches of a substrate formed on a contacting layer comprising the steps of:
depositing an oxide layer on the substrate;
depositing a layer of silicon nitride on the oxide layer thereby forming an oxide layer/silicon nitride interface;
etching trenches through said silicon nitride layer, said oxide layer, and said substrate to expose the contacting layer;
selectively filling the trenches with a tungsten metal to a level substantially even with said oxide layer/silicon nitride interface; and
removing the silicon nitride layer with a phosphoric acid.

9. The process of claim 8, wherein said trenches have a width between approximately 6000 angstroms and approximately 10,000 angstroms.

10. The process of claim 8, wherein said step of etching the trenches is conducted by exposing the substrate to a fluorine based-plasma etchant.

11. The process of claim 8, wherein said removing step comprises stripping the silicon nitride layer off at a faster rate than the substrate.

12. The process of claim 8, wherein said removing step comprises applying hot phosphoric acid having a temperature of approximately 160 degrees centigrade to remove the silicon nitride layer.

13. The process of claim 8, wherein said step of depositing forms a silicon nitride layer of between approximately 1000 angstroms to 1500 angstroms in thickness.

14. The process of claim 12, wherein said thickness of said silicon nitride layer is proportional to the exposure time to phosphoric acid.

* * * * *